United States Patent
Kim et al.

(10) Patent No.: US 6,218,690 B1
(45) Date of Patent: Apr. 17, 2001

(54) TRANSISTOR HAVING REVERSE SELF-ALIGNED STRUCTURE

(75) Inventors: Hyoung-sub Kim, Seoul; Ja-hum Ku, Seongnam; Chul-sung Kim, Anyang; Jung-woo Park, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/376,041

(22) Filed: Aug. 16, 1999

(30) Foreign Application Priority Data

Aug. 14, 1998 (KR) .................................................. 98-33068

(51) Int. Cl.[7] .................................................. H01L 29/76
(52) U.S. Cl. .................. 257/288; 257/288; 257/382; 257/383; 257/384; 257/388; 257/413
(58) Field of Search .................... 257/382, 383, 257/384, 388, 413, 288

(56) References Cited

U.S. PATENT DOCUMENTS

| 5,633,522 | * | 5/1997 | Dorleans et al. | 257/344 |
| 5,659,194 | * | 8/1997 | Iwamatsu et al. | 29/76 |
| 5,723,893 | * | 3/1998 | Yu et al. | 257/413 |
| 5,739,573 | * | 4/1998 | Kawaguchi | 257/384 |
| 5,914,518 | * | 6/1999 | Nguyen et al. | 257/377 |
| 5,982,001 | * | 11/1999 | Wu | 257/344 |
| 6,025,241 | * | 2/2000 | Lin et al. | 438/303 |
| 6,066,894 | * | 5/2000 | Yokozeki | 257/754 |

FOREIGN PATENT DOCUMENTS

| 403080542 | * | 6/1992 | (JP) | 257/384 |
| 404162563 | * | 6/1992 | (JP) | 257/382 |
| 405136398 | * | 6/1993 | (JP) | 257/382 |

* cited by examiner

Primary Examiner—Eddie C. Lee
Assistant Examiner—Edgardo Ortiz
(74) Attorney, Agent, or Firm—Marger Johnson & McCollom, P.C.

(57) ABSTRACT

A reverse self-aligned field effect transistor and a method of fabricating the same are provided. The reverse self-aligned transistor includes a source formed on an active region of a semiconductor substrate and a drain formed on the active region of the semiconductor substrate, the drain being positioned a predetermined distance from the source. A silicide film is formed on the source and the drain. Insulative film spacers are formed on sidewalls of a trench, the trench being formed by etchin the semiconductor substrate between the source and the drain. A gate insulative film is formed on a lower portion of the trench and a metal gate is formed on the gate insulative film between the insulative film spacers. The metal gate is electrically isolated from the source and the drain by the insulative film spacers.

9 Claims, 3 Drawing Sheets

TRANSISTOR HAVING REVERSE SELF-ALIGNED STRUCTURE

BACKGROUND OF THE INVENTION

1. Field of the Invention

The present invention relates to a semiconductor device and, more particularly, to a field effect transistor (FET) having a reverse self-aligned structure and a method of fabricating the same.

2. Description of the Related Art

As integration increases, semiconductor devices become smaller requiring low resistivity materials to reduce signal delay. Silicide or metal having significantly low resistivity is frequently applied to lower sheet resistance and contact resistance between a gate and a source/drain. In particular, a self-aligned silicide (salicide) process is often used for selectively forming a low resistivity metal silicide film on only a gate electrode and a source/drain region of a transistor without photolithography.

However, when a gate and an active region become smaller with reduced pattern sizes, resistivity of silicide in a gate line increases during the salicide process as shown in FIG. 1. In an active region, silicide becomes relatively thinner, generating voids by a difference in diffusion speed and a partial stress generated below the spacer formed on the sides of a gate due to a pattern. When a shallow junction is made to reduce a short channel effect due to transistor size reduction, current leakage occurs in a junction layer due to silicide. When the salicide process is performed after a gate line is formed, a defect such as dislocation, is generated on a semiconductor substrate below the edge of a gate thus increasing leakage current. In order to reduce dependence on the gate line size as described above, research has been made into using metal, such as tungsten (W), as a gate formation material.

Accordingly, a need remains for a semiconductor device and a method for fabricating the same that prevents the generation of the above-described defects.

SUMMARY OF THE INVENTION

It is an object of the present invention to overcome the problems associated with prior art semiconductor devices and methods for fabricating the same.

It is another object of the present invention to provide a semiconductor device that facilitates formation of silicide in a fine active region.

It is yet another object of the present invention to provide a semiconductor device having reduced size dependence on the gate line.

It is yet another object of the present invention to provide an appropriate method for fabricating the semiconductor device.

Accordingly, a reverse self-aligned transistor is provided. The reverse self-aligned transistor includes a source formed on an active region of a semiconductor substrate and a drain formed on the active region of the semiconductor substrate, the drain being positioned a predetermined distance from the source. A silicide film is formed on the source and the drain. Insulative film spacers are formed on sidewalls of a trench, the trench being formed by etching the semiconductor substrate between the source and the drain. A gate insulative film is formed on a lower portion of the trench and a metal gate is formed on the gate insulative film between the insulative film spacers. The metal gate is electrically isolated from the source and the drain by the insulative film spacers.

The silicide film is made of a compound of silicon and a material selected from the group consisting of titanium (Ti), cobalt (Co), tantalum (Ta), tungsten (W), a complex film of titanium (Ti) and tungsten (W), and a double film of titanium (Ti) and cobalt (Co). A capping layer made of silicon nitride film having a thickness between about 100 to 1000 Å may be further formed on the silicide film. The capping layer improves a refractory propriety of the silicide.

The gate is formed of tungsten (W) or titanium nitride (TiN). A diffusion preventing film may be further formed for preventing the gate from being diffused into the semiconductor substrate. The diffusion preventing film is formed of tungsten nitride ($WN_x$).

A method for fabricating a reverse self-aligned transistor is also provided. The method includes forming a junction region in an active region of a semiconductor substrate, forming a silicide film on a surface of the junction region, and forming an interlayer insulative film on the semiconductor substrate. The method further includes forming a trench through the junction region exposing the semiconductor substrate, forming insulative film spacers on sidewalls of the trench, forming a gate insulative film on a lower portion of the trench, and forming a gate self-aligned to the spacers within the trench.

Forming the junction region includes forming a junction region in an active region of the semiconductor substrate using an impurity injection and diffusion process. Forming a junction region may include thermally processing the resultant structure. Forming the silicide film includes forming the silicide film of a material selected from group consisting of titanium (Ti), cobalt (Co), tantalum (Ta) and tungsten (W), or can be a complex film of titanium (Ti) and tungsten (W), or a double film of titanium (Ti) and cobalt (Co).

The method may further include forming a capping layer on the junction region before forming the interlayer insulative film for improving a refractory property of the silicide film. The capping layer is made of a silicon nitride film having a thickness between about 100 to 1000 Å.

The method may further include forming a diffusion preventing film for preventing the gate from being diffused to the semiconductor substrate. Forming the diffusion preventing film includes forming the diffusion preventing film of titanium nitride (TiN) or tungsten nitride ($WN_x$).

Forming the gate includes forming the gate of tungsten (W). Forming the gate includes depositing a metal film on the semiconductor substrate between the spacers and planarizing the metal film. Planarizing the metal film includes planarizing the metal film using a chemical mechanical polishing (CMP) or etch back process, or a process using both chemical mechanical polishing (CMP) and etch back processes.

According to the present invention, a silicide formation process is performed in a wide region of the substrate lacking a pattern such as a gate. Thus, defects are not generated on the semiconductor substrate below the edges of the gate when the silicide reaction occurs. Also, sheet resistivity is reduced because the gate is formed of metal thereby reducing dependence on gate pattern size.

BRIEF DESCRIPTION OF THE DRAWINGS

The foregoing and other objects, features, and advantages of the present invention will become more readily apparent from the following detailed description of a preferred embodiment that proceeds with reference to the following drawings.

DESCRIPTION OF THE PREFERRED EMBODIMENT

Figure 1:
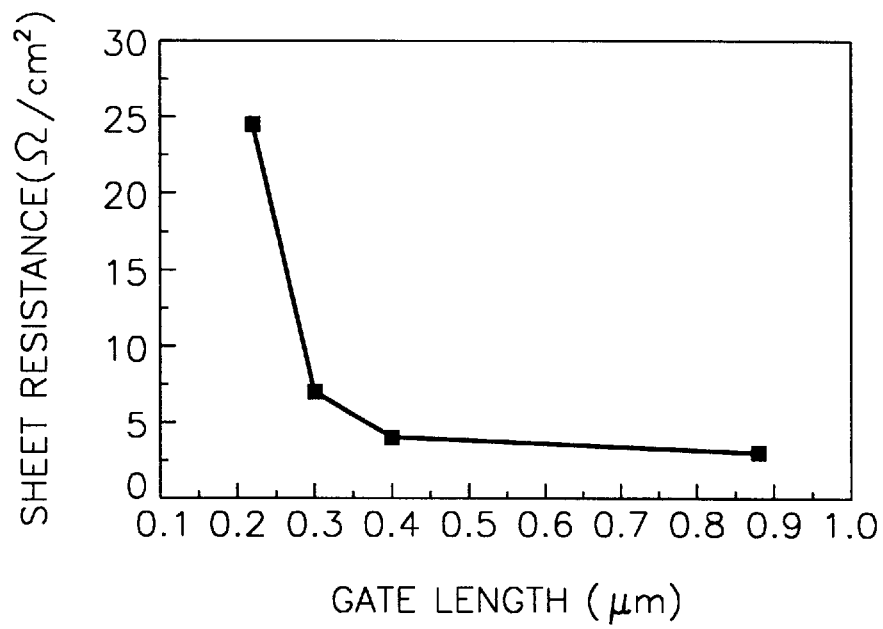
FIG. 1 is a graph of titanium silicide (TiSi$_2$) sheet resistance according to gate length.

Embodiments of the present invention can be modified into various other forms. The scope of the present invention must not be interpreted as being restricted to the specific embodiments shown. The embodiments are provided to more completely explain the present invention to those skilled in the art. In the drawings, the thicknesses of layers or regions are exaggerated for clarity. Like reference numerals in the drawings denote the same members. Also, when a layer is described as being formed on another layer or substrate, the layer can be formed directly on the other layer or substrate or other layers can intervene therebetween.

In the present invention, a gate is formed after forming a source/drain and silicide. To facilitate formation of the silicide in a fine active region, a metal gate structure having low size dependence in a gate line is applied. To do so, the present invention uses a reverse self-aligned FET (field effect transistor) structure.

Figure 2:
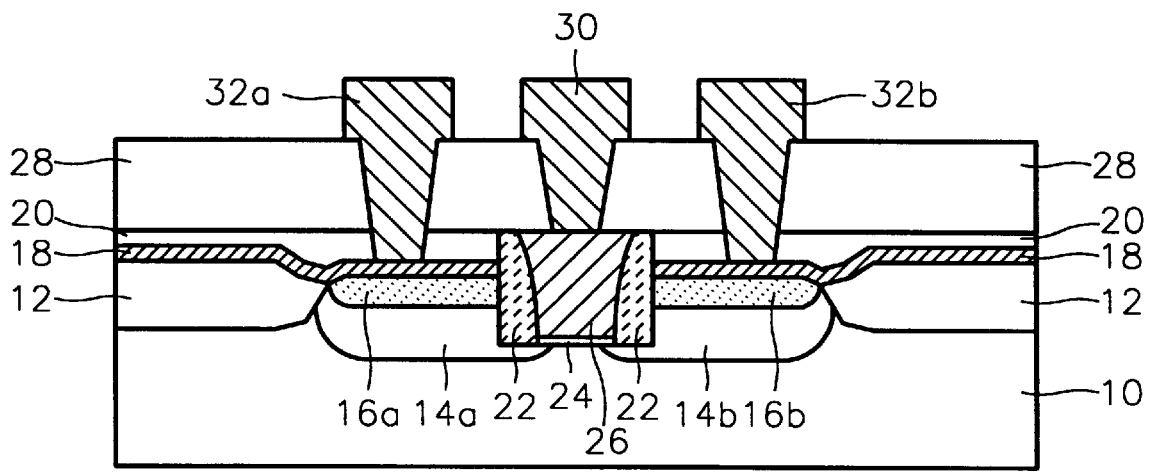
FIG. 2 is a cross section of a transistor having a reverse self-aligned structure according to the present invention.

FIG. 2 is a cross section of a transistor having a reverse self-aligned structure according to the present invention. Referring to FIG. 2, the reverse self-aligned transistor according to the present invention includes a source 14a and a drain 14b. The source 14a and drain 14b are formed spaced apart by a predetermined interval in an active region of a semiconductor substrate 10 defined by a field oxide film 12. Silicide films 16a and 16b are respectively formed on the source 14a and the drain 14b. An insulative film spacer 22 is formed on each sidewall of a trench formed by etching the semiconductor substrate between the source and the drain. The source and the drain are electrically separated by the spacer 22. A metal gate 26 having a gate insulative film 24 is formed between the spacers 22. First and second interlayer insulative films 20 and 28 are formed covering the semiconductor substrate on which the gate, source, and drain are formed. Metal electrodes 30, 32a, and 32b are formed on the second layer insulative film 28. The electrodes 30, 32a, and 32b are capable of being connected respectively to the gate, the source, and the drain via contact holes formed through the interlayer insulative films.

The silicide films 16a and 16b formed on the source 14a and the drain 14b improve the operation speed of the device by reducing the resistance of the transistor. The silicide films 16a and 16b are formed of a refractory metal such as titanium (Ti), cobalt (Co), tantalum (Ta), and tungsten (W), a complex film of titanium (Ti) and tungsten (W), or a double film of titanium (Ti) and cobalt (Co). In order to improve refractory properties of the silicide films 16a and 16b, a capping layer 18, comprised of a silicon nitride film about 100 to 1000 Å thick, can be further formed on the surface of the silicide films 16a and 16b as shown in FIG. 2.

The gate 26 is formed of metal such as tungsten (W). In order to prevent the material forming the gate from being diffused into the semiconductor substrate 10, a diffusion prevention film 24 of titanium nitride (TiN) or tungsten nitride (WN$_x$) can be included.

Figure 3:
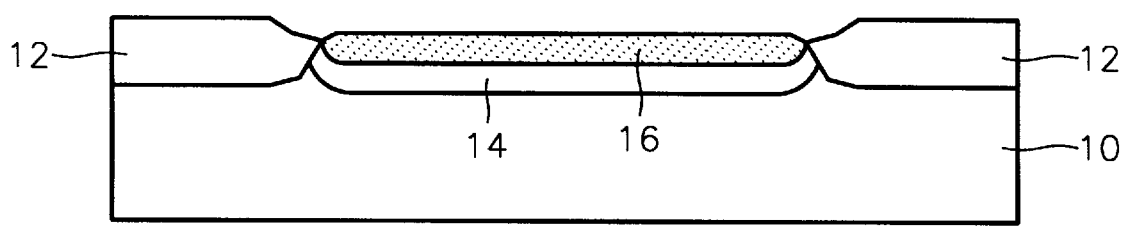
FIGS. 3 through 7 are cross-sectional views illustrating a method for fabricating the transistor having a reverse self-aligned structure according to the present invention.

FIGS. 3 through 7 are cross-sectional views of a method for fabricating a transistor having a reverse self-aligned structure according to an embodiment of the present invention. Referring to FIG. 3, a field oxide film 12 is formed on a semiconductor substrate 10 by a conventional isolation process such as selective oxidation (LOCOS). The field oxide film 12 defines an active region and a field region. A junction region 14 that later becomes a source and drain of a transistor, is formed in the active region of the semiconductor substrate using a conventional ion implantation process and an activation process.

A refractory metal, such as titanium (Ti), cobalt (Co), tantalum (Ta), tungsten (W), a complex film of titanium (Ti) and tungsten (W), or a double film of titanium (Ti) and cobalt (Co), is deposited on the active region of the semiconductor substrate, thereby forming a metal silicide film 16. The silicide film 16 is a compound produced by thermally processing the metal film and the silicon of the semiconductor substrate. The silicide film 16 is formed by a thermal process using a furnace or a rapid thermal process (RTP). The non-reacted metal film is removed by wet etching, allowing silicide to remain on only the upper portion of the junction region 14 formed in the active region. The silicide formation process is performed on a wide area on which a pattern such as a gate is not formed, thus preventing defects from being generated on the semiconductor substrate under the edges of the gate when the silicide reaction occurs.

Figure 4:
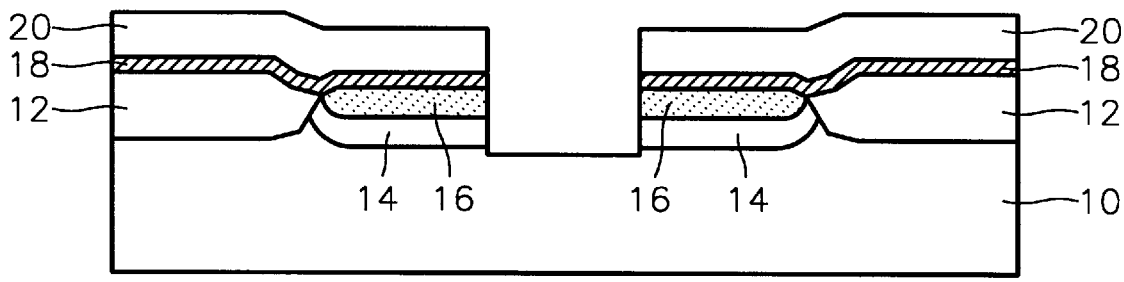

Referring to FIG. 4, a capping layer 18 is formed by depositing a silicon nitride film (Si$_3$N$_4$) about 100 to 1000 Å on the entire surface of the semiconductor substrate 10 on which silicide 16 is formed. The capping layer 18 improves the refractory properties of the silicide in subsequent thermal treatment processes such as the gate oxide film formation process. A first interlayer insulative film 20 is formed by depositing an insulative film such as an oxide film on the capping layer 18.

After conventional photolithography defines a region to form a gate, the first interlayer insulative film 20, the capping layer 18, silicide 16, and the junction layer 14 of the gate region are sequentially anisotropically etched to form a trench. Here, the trench is deeper than the junction layer to prevent short circuits between the source and the drain formed later.

Figure 5:
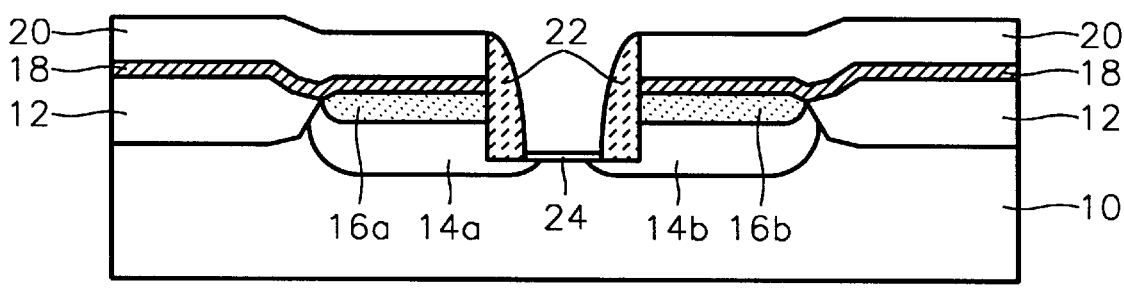

Referring to FIG. 5, an oxide film or a nitride film is deposited on the entire surface of the resultant substrate on which the trench is formed, and the oxide or nitride film is anisotropically etched, thereby forming spacers 22 on the inner sidewalls of the trench. In order to remove damage to the semiconductor substrate in a channel region during etching for forming the trench or anisotropic etching for forming the spacers, sacrificial oxidation is performed over the entire surface of the resultant structure, and then a sacrificial oxide film is removed by wet etching. A gate insulative film 24 is formed by growing a thin thermal oxide film. After the sacrificial oxidation and the formation of the gate insulative film, impurities are injected into the junction region for the source and drain diffusing up to an area under the gate insulative film 24 thereby forming the source 14a and the drain 14b.

Figure 6:
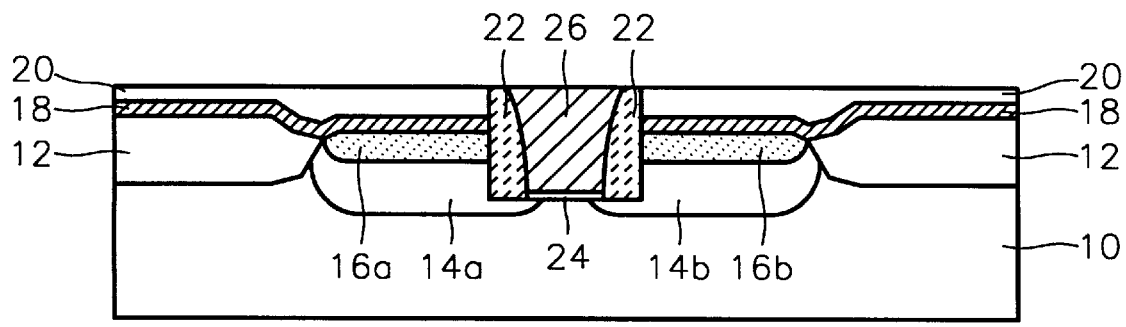

Referring to FIG. 6, a metal film having low resistivity, such as tungsten (W), is deposited on the resultant structure on which the gate insulative film 24 is formed thereby forming a gate conductive layer 26. In order to prevent the metal in the metal film from diffusing down, a diffusion preventing film can be formed by depositing titanium nitride (TiN) or tungsten nitride (WN$_x$) before depositing the metal film. The surface of the metal film is planarized to the extent that the capping layer 18 is not exposed as shown in FIG. 6. The surface of the metal film is planarized by performing chemical mechanical polishing (CMP), etch back, or a process using both the CMP and the etch back processes on the metal film and the interlayer insulative film. Thus, a self-aligned gate 26 is formed without photolithography and etching.

Figure 7:
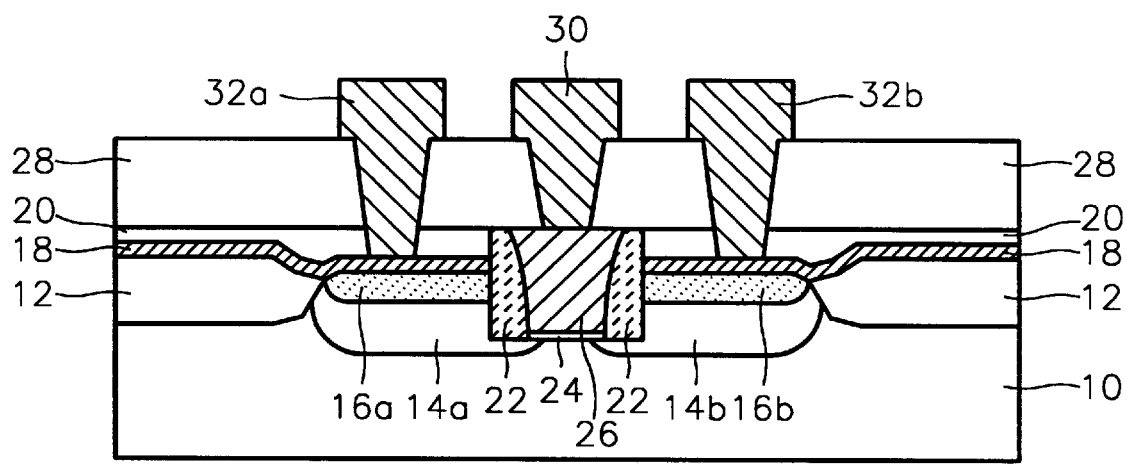

Referring to FIG. 7, a second interlayer insulative film 28 is formed by depositing an insulative film on the entire surface of the resultant structure on which the gate is formed. Contact holes exposing parts of the gate 26, the silicide 16a on the source 14a, and the silicide 16b on the drain 14b are formed by partially etching the first and second interlayer insulative films. A metal film used as a wiring layer is deposited on the entire surface of the resultant structure and patterned thereby forming metal electrodes 30, 32a, and 32b.

In the reverse self-aligned transistor and a fabrication method thereof according to the present invention, the gate is formed after forming, a source, a drain, and silicide in an active region of a semiconductor substrate. Since a silicide formation process is performed in a wide region in a state which a pattern such as the gate is not formed, defects are not generated on a semiconductor substrate below the edges of the gate when the silicide reaction occurs. Also, since the gate is formed of metal, resistivity is lowered, and dependence on pattern size in the gate is reduced.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A reverse self-aligned transistor, comprising:
   a source formed on an active region of a semiconductor substrate;
   a drain formed on the active region of the semiconductor substrate, the drain being positioned a predetermined distance from the source;
   a silicide film formed on the source and the drain;
   a trench formed in between the source and the drain, the trench being in contact with the source and the drain and the trench being recessed in substrate;
   insulative film spacers formed on sidewalls of the trench;
   a gate insulative film formed on a lower portion of the trench; and
   a metal gate formed on the gate insulative film between the insulative film spacers, the metal gate being electrically isolated from the source and the drain by the insulative film spacers.

2. The reverse self-aligned transistor according to claim 1 wherein the silicide film is a compound of silicon and one material selected from the group consisting of titanium (Ti), cobalt (Co), tantalum (Ta), tungsten (W), a complex film of titanium (Ti) and tungsten (W), and a double film of titanium (Ti) and cobalt (Co).

3. The reverse self-aligned transistor according to claim 1 including a capping layer formed on the silicide film adapted to improve a refractory property of the silicide film.

4. The reverse self-aligned transistor according to claim 3 wherein the capping layer is a silicon nitride film having a thickness between about 100 to 1000 Å.

5. The reverse self-aligned transistor according to claim 1 wherein the metal gate is formed of tungsten (W).

6. The reverse self-aligned transistor according to claim 1 including a diffusion preventing film formed below the metal gate for preventing a metal in the metal gate from being diffused into the semiconductor substrate.

7. The reverse self-aligned transistor according to claim 6 wherein the diffusion preventing film is formed of titanium nitride (TiN).

8. The reverse self-aligned transistor according to claim 1, including:
   at least one interlayer insulative film covering the semiconductor substrate on which the gate, the source, and the drain are formed; and
   a plurality of metal electrodes connected to the source, the drain, and the metal gate via contact holes.

9. The reverse self-aligned transistor according to claim 6 wherein the diffusion preventing film is formed of tungsten nitride (WNx).

* * * * *

UNITED STATES PATENT AND TRADEMARK OFFICE
CERTIFICATE OF CORRECTION

PATENT NO. : 6,218,690 B1
DATED : April 17, 2001
INVENTOR(S) : Kim et al.

It is certified that error appears in the above-identified patent and that said Letters Patent is hereby corrected as shown below:

<u>Title page,</u>
Item [57], ABSTRACT,
Line 9, "by etchin the" should read -- by etching the --

<u>Column 2,</u>
Line 8, "propriety" should read -- property --

<u>Column 3,</u>
Line 50, "speed ofthe" should read -- speed of the --

<u>Column 6,</u>
Line 28, "claim 6" should read -- claim 1 --
Line 40, "(WNx)" should read -- (WN$_x$) --

Signed and Sealed this

Sixth Day of August, 2002

*Attest:*

JAMES E. ROGAN
*Director of the United States Patent and Trademark Office*

*Attesting Officer*